(12) United States Patent
Lin et al.

(10) Patent No.: US 11,043,486 B2
(45) Date of Patent: Jun. 22, 2021

(54) ESD PROTECTION DEVICES

(71) Applicant: Vanguard International Semiconductor Corporation, Hsinchu (TW)

(72) Inventors: Chih-Hsuan Lin, Hsinchu (TW); Shao-Chang Huang, Hsinchu (TW); Jia-Rong Yeh, Taipei (TW); Yeh-Ning Jou, Hsinchu (TW); Hwa-Chyi Chiou, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 276 days.

(21) Appl. No.: 16/183,421

(22) Filed: Nov. 7, 2018

(65) Prior Publication Data

US 2020/0144246 A1 May 7, 2020

(51) Int. Cl.
*H01L 27/02* (2006.01)
(52) U.S. Cl.
CPC ................ *H01L 27/0259* (2013.01)
(58) Field of Classification Search
CPC ...................... H01L 27/0248–0262
See application file for complete search history.

(56) References Cited

U.S. PATENT DOCUMENTS

| 5,851,858 | A * | 12/1998 | Mueller | H01L 21/84 |
| | | | | 438/154 |
| 6,303,961 | B1 * | 10/2001 | Shibib | H01L 27/1203 |
| | | | | 257/107 |
| 10,037,988 | B1 * | 7/2018 | Solaro | H01L 27/06 |
| 2002/0050615 | A1 * | 5/2002 | Ker | H01L 27/0251 |
| | | | | 257/355 |
| 2008/0316659 | A1 * | 12/2008 | Oguzman | H01L 27/0259 |
| | | | | 361/56 |
| 2013/0020646 | A1 * | 1/2013 | Deval | H01L 29/861 |
| | | | | 257/355 |
| 2014/0353799 | A1 * | 12/2014 | Hwang | H01L 29/732 |
| | | | | 257/577 |
| 2017/0346278 | A1 * | 11/2017 | Lai | H01L 29/404 |
| 2018/0323183 | A1 * | 11/2018 | Chen | H01L 27/0259 |
| 2018/0323184 | A1 * | 11/2018 | Hung | H01L 27/0259 |

FOREIGN PATENT DOCUMENTS

TW 473977 B 1/2002

OTHER PUBLICATIONS

Taiwanese Office Action and Search Report, dated Jan. 31, 2019, for Taiwanese Application No. 107126320.

* cited by examiner

*Primary Examiner* — Fred E Finch, III
(74) *Attorney, Agent, or Firm* — Birch, Stewart, Kolasch & Birch LLP

(57) ABSTRACT

A semiconductor structure includes a first P-well, a first P-type diffusion region, a first N-type diffusion region, a second P-type diffusion region, and a first poly-silicon layer. The first P-type diffusion region is deposited in the first P-well and coupled to a first electrode. The first N-well is adjacent to the P-well. The first N-type diffusion region is deposited in the first N-well. The second P-type diffusion region is deposited between the first P-type diffusion region and the first N-type diffusion region, which is deposited in the first N-well. The second P-type diffusion region and the first N-type diffusion region are coupled to a second electrode. The first poly-silicon layer is deposited on the first P-type diffusion region.

13 Claims, 10 Drawing Sheets

ESD PROTECTION DEVICES

BACKGROUND OF THE INVENTION

Field of the Invention

The disclosure relates generally to a semiconductor structure, and more particularly it relates to a semiconductor structure for electrostatic discharge (ESD) device.

Description of the Related Art

Integrated circuits can be seriously damaged by any kind of electrostatic discharge. The most common cause of electrostatic discharge is the human body, which is known as the Human Body Model (HBM). Several amperes of peak current can be generated by the human body in about 100 nanoseconds, and this can flow to an integrated circuit, which can damage the integrated circuit. The second most common cause of electrostatic discharge is metal objects, known as the Machine Model (MM). Current generated in the Machine Model has a shorter rise time and a higher current level than that in the Human Body Model. The third mechanism is the Charged-Device Model (CDM), in which an accumulated charge in the integrated circuit is discharged to ground in less than 0.5 nanoseconds of rise time. Therefore, an effective ESD protection device is required to prevent the integrated circuit from damage caused by ESD.

BRIEF SUMMARY OF THE INVENTION

In an embodiment, a semiconductor structure includes a first P-well, a first P-type diffusion region, a first N-type diffusion region, a second P-type diffusion region, and a first poly-silicon layer. The first P-type diffusion region is deposited in the first P-well and coupled to a first electrode. The first N-well is adjacent to the P-well. The first N-type diffusion region is deposited in the first N-well. The second P-type diffusion region is deposited between the first P-type diffusion region and the first N-type diffusion region, which is deposited in the first N-well. The second P-type diffusion region and the first N-type diffusion region are coupled to a second electrode. The first poly-silicon layer is deposited on the first P-type diffusion region.

According to an embodiment of the invention, the semiconductor structure further comprises an epitaxial layer, a second P-well, and a second N-well. The second P-well is deposited on the epitaxial layer, and the first P-well is deposited in the second P-well. The second N-well is deposited on the epitaxial layer and adjacent to the second P-well, in which the first N-well is deposited in the second N-well. The epitaxial layer is N-type.

According to an embodiment of the invention, the first poly-silicon layer is coupled to the first electrode.

According to another embodiment of the invention, the first poly-silicon layer is floating.

According to an embodiment of the invention, the semiconductor structure further comprises a first oxidative protection layer and a shallow trench isolation. The first oxidative protection layer is deposited on the second P-type diffusion region and adjacent to the first poly-silicon layer, in which there is a first distance between the oxidative protection layer and the first poly-silicon layer. The shallow trench isolation is deposited between the first P-type diffusion region and the second P-type diffusion region.

According to an embodiment of the invention, there is a second distance between the first P-type diffusion region and the shallow trench isolation, and the second P-type diffusion region is directly coupled to the shallow trench isolation.

According to an embodiment of the invention, the first poly-silicon layer is deposited on the first P-type diffusion region and the second P-type diffusion region.

According to an embodiment of the invention, the semiconductor structure further comprises a second poly-silicon layer. The second poly-silicon layer is deposited on the second P-type diffusion region and the first N-type diffusion region, in which the second poly-silicon region is floating.

In another embodiment, an ESD protection device for discharging electrostatic charge from a first electrode to a second electrode comprises a first P-well, a first P-type diffusion region, a first N-well, a first N-type diffusion region, a second P-type diffusion region, and a first poly-silicon layer. The first P-type diffusion region is deposited in the first P-well and coupled to the first electrode. The first N-well is adjacent to the first P-well. The first N-type diffusion region is deposited in the first N-well. The second P-type diffusion region is deposited between the first P-type diffusion region and the first N-type diffusion region, and deposited in the first N-well. The second P-type diffusion region and the first N-type diffusion region are coupled to the second electrode. The first poly-silicon layer is deposited on the first P-type diffusion region.

According to an embodiment of the invention, the first poly-silicon layer is coupled to the first electrode.

According to another embodiment of the invention, the first poly-silicon layer is floating.

According to an embodiment of the invention, the ESD protection device further comprises a first oxidative protection layer and a shallow trench isolation. The first oxidative protection layer is deposited on the second P-type diffusion region and adjacent to the first poly-silicon layer. There is a first distance between the oxidative protection layer and the first poly-silicon layer. The shallow trench isolation is deposited between the first P-type diffusion region and the second P-type diffusion region.

According to an embodiment of the invention, there is a second distance between the first P-type diffusion region and the shallow trench isolation, and the second diffusion region is directly coupled to the first shallow trench isolation.

According to an embodiment of the invention, the first poly-silicon layer is deposited on the first P-type diffusion region and the second P-type diffusion region.

According to an embodiment of the invention, the ESD protection device further comprises a second poly-silicon layer. The second poly-silicon layer is deposited on the second P-type diffusion region and the first N-type diffusion region, wherein the second poly-silicon layer is floating.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
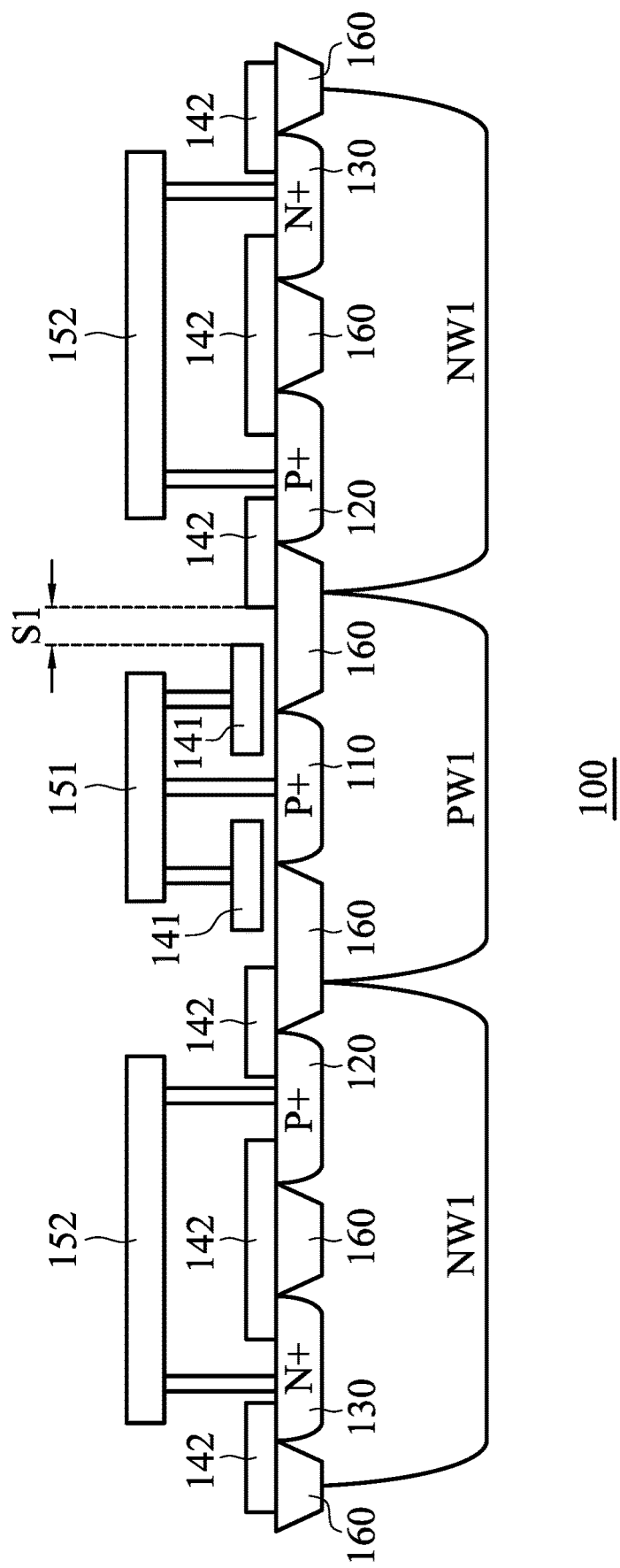
FIG. 1 is a cross-sectional view of a semiconductor structure in accordance with an embodiment of the invention.

The semiconductor device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should also be noted that the present disclosure presents embodiments of a semiconductor device, and may be included in an integrated circuit (IC) such as a microprocessor, memory device, and/or other device. The IC may also include various passive and active microelectronic devices, such as thin film resistors, other capacitors (e.g. a metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize that the high-voltage semiconductor devices may be used in other type of semiconductor elements.

FIG. 1 is a cross-sectional view of a semiconductor structure in accordance with an embodiment of the invention. As shown in FIG. 1, the semiconductor structure 100 includes a first P-well PW1 and a first N-well NW1. The first P-type diffusion region 110 is deposited in the first P-well PW1, and the second P-type diffusion region 120 and the first N-type diffusion region 130 are deposited in the first N-well NW1.

According to an embodiment of the invention, the semiconductor structure 100 further includes a first poly-silicon layer 141 and an oxidation protective layer 142. As shown in FIG. 1, the first poly-silicon layer 141 is formed on the first P-type diffusion region 110, and the oxidation protective layer 142 is formed on the second P-type diffusion region 120 and the first N-type diffusion region 130, in which there is a first distance S1 between the first poly-silicon layer 141 and the oxidation protective layer 142.

According to an embodiment of the invention, as shown in FIG. 1, the first poly-silicon layer 141 is coupled to the first electrode 151. According to an embodiment of the invention, the first N-well NW1 is surrounding the first P-well PW1. Therefore, in the cross-sectional view of FIG. 1, the first N-well NW1 is deposited in both sides of the first P-well PW1.

As shown in FIG. 1, the first P-type diffusion region 110 is coupled to the first electrode 151, and the second P-type diffusion region 120 and the first N-type diffusion region 130 are coupled to the second electrode 152. According to an embodiment of the invention, the first electrode 151 and the second electrode 152 are metal layers.

As shown in FIG. 1, the shallow trench isolation (STI) 160 is deposited among the first P-type diffusion region 110, the second P-type diffusion region 120, and a first N-type diffusion region 130, which is configured to electrically isolate the first P-type diffusion region 110, the second P-type diffusion region 120, and a first N-type diffusion region 130 from one another.

According to an embodiment of the invention, the first P-type diffusion region 110, the first N-type diffusion region 130 and the second P-type diffusion region 120 form an PNP transistor, in which the first P-type diffusion region 110 is a collector, the first N-type diffusion region 130 is a base, and the second P-type diffusion region 130 is an emitter.

According to an embodiment of the invention, the semiconductor structure 100 in FIG. 1 is an ESD device. According to an embodiment of the invention, the first electrode 151 is coupled to a pad of the supply voltage, and the second electrode 152 is coupled to the ground, in which the semiconductor structure 100 is configured to expel the electrostatic charge accumulated in the pad of the supply voltage to the ground.

According to another embodiment of the invention, the first electrode 151 is coupled to the output/input pad, and the second electrode 152 is coupled to the ground, in which the semiconductor structure 100 is configured to expel the electrostatic charge accumulated in the output/input pad to the ground.

According to an embodiment of the invention, the first poly-silicon layer 141 is configured to generate free electron-hole pairs in the first P-type diffusion region 110, in order to improve the protection capability of ESD machine mode (MM). According to an embodiment of the invention, the protection capability of ESD machine mode of the semiconductor structure 110 reaches 550V.

Figure 2:
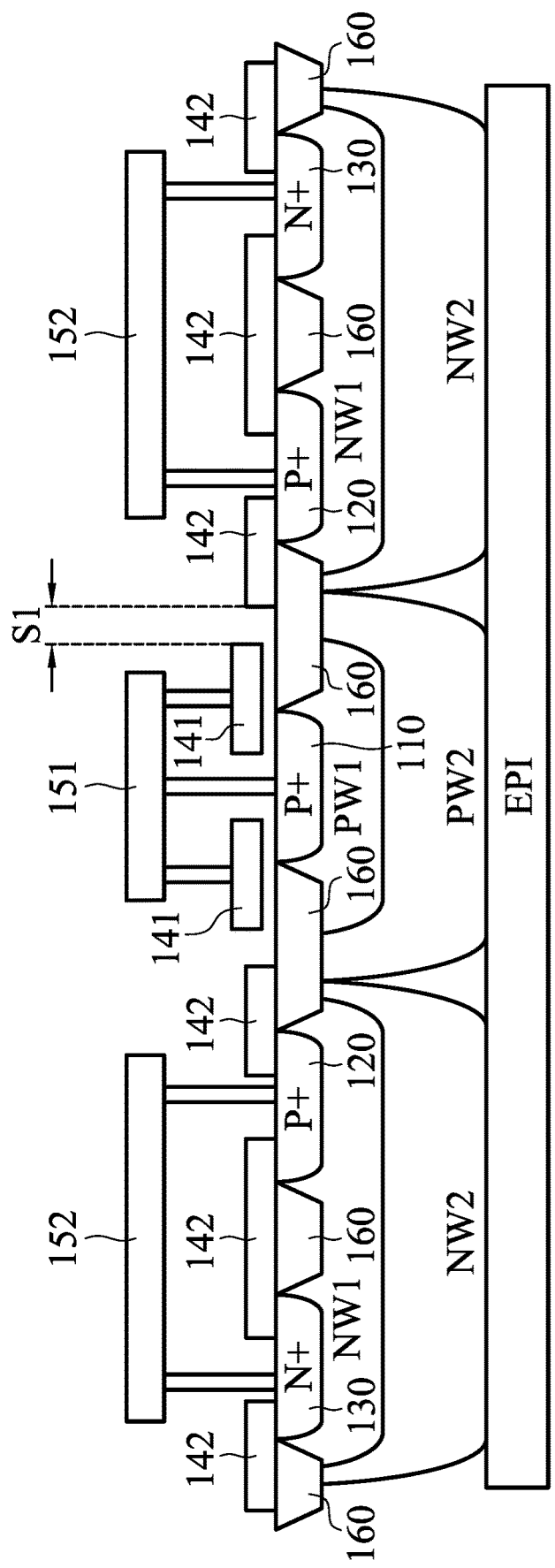
FIG. 2 is a cross-sectional view of a semiconductor structure in accordance with another embodiment of the invention.

FIG. 2 is a cross-sectional view of a semiconductor structure in accordance with another embodiment of the invention. Compared to FIG. 1, the semiconductor structure 200 in FIG. 2 further includes a second P-well PW2, a second N-well NW2, and an epitaxial layer EPI. The first P-well PW1 is deposited in the second P-well PW2, and the first N-well NW1 is deposited in the second N-well NW2. The second P-well PW2 and the second N-well NW2 are deposited on the epitaxial layer EPI. According to an embodiment of the invention, the epitaxial layer is N-type. According to an embodiment of the invention, the second P-well PW2, the second N-well NW2, and the epitaxial layer EPI are configured to reduce the path resistance that ESD flows through, in order to effectively improve the protection capability of ESD machine mode.

Figure 3:
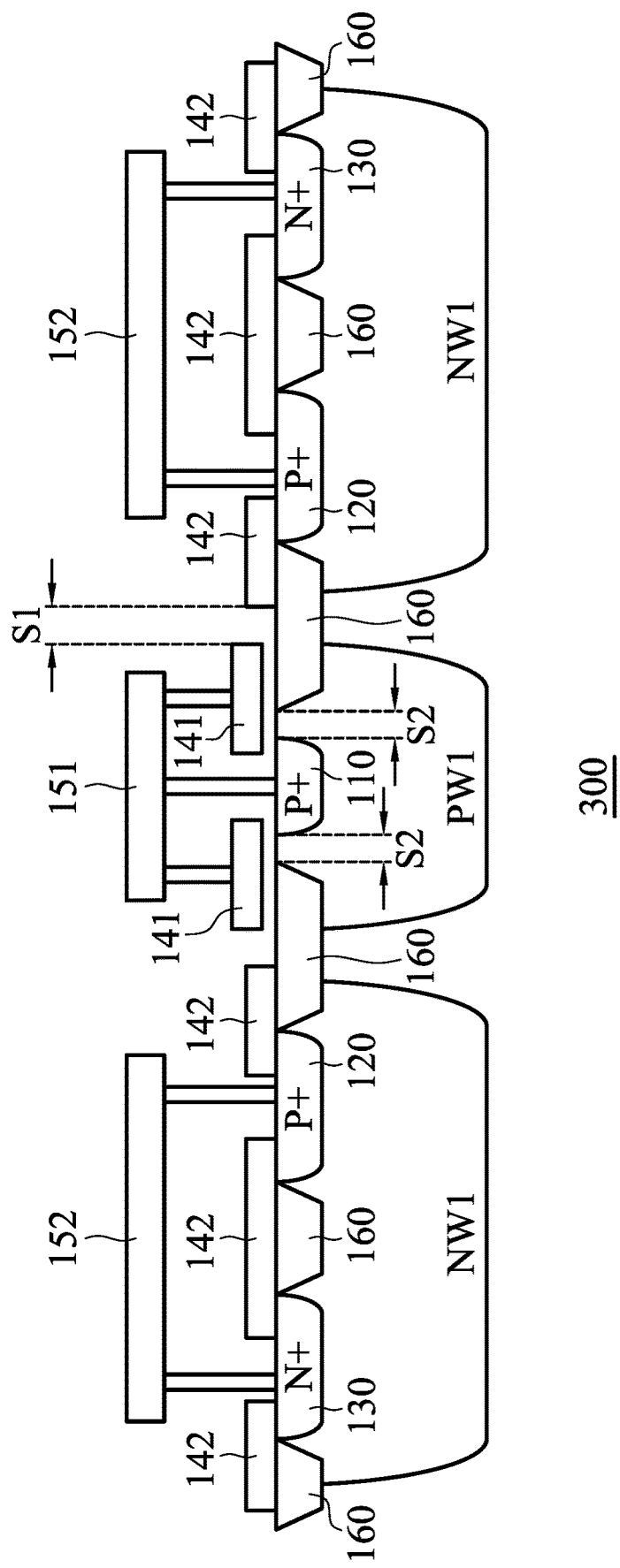
FIG. 3 is a cross-sectional view of a semiconductor structure in accordance with another embodiment of the invention.

FIG. 3 is a cross-sectional view of a semiconductor structure in accordance with another embodiment of the invention. Comparing the semiconductor structure in FIG. 3 with the semiconductor structure in FIG. 1, there is a second distance S2 between the first P-type diffusion 110 and the STI 160, which is configured to increase the distance and the resistance between the first P-type diffusion region 110 and the second P-type diffusion region 120, in order to improve the protection capability of ESD machine mode.

Figure 4:
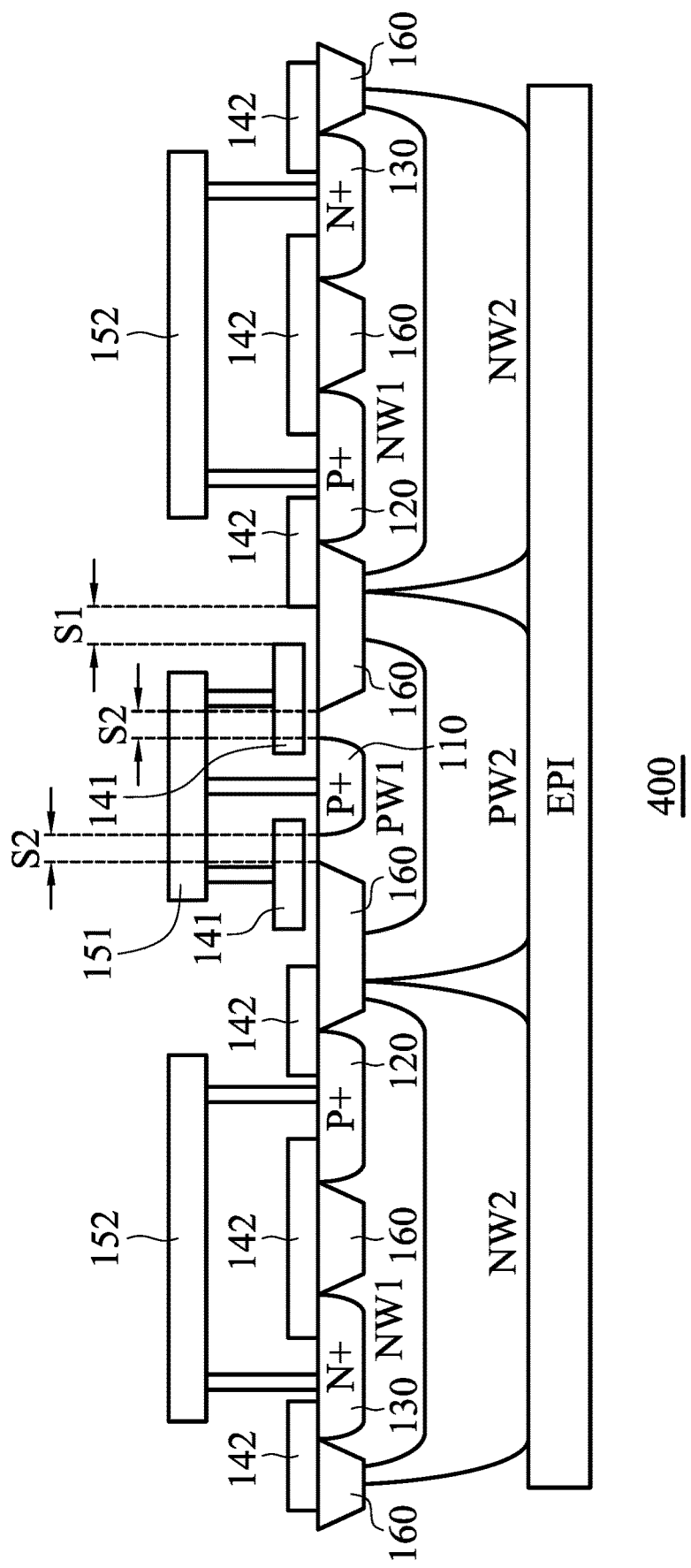
FIG. 4 is a cross-sectional view of a semiconductor structure in accordance with another embodiment of the invention.

FIG. 4 is a cross-sectional view of a semiconductor structure in accordance with another embodiment of the invention. Comparing the semiconductor structure 400 in FIG. 4 with the semiconductor structure 200 in FIG. 2, the semiconductor structure 400 in FIG. 4 further includes a second distance S2 between the first P-type diffusion region 110 and the STI 160, in which the second distance S2 is configured to improve the protection capability of ESD machine mode.

Figure 5:
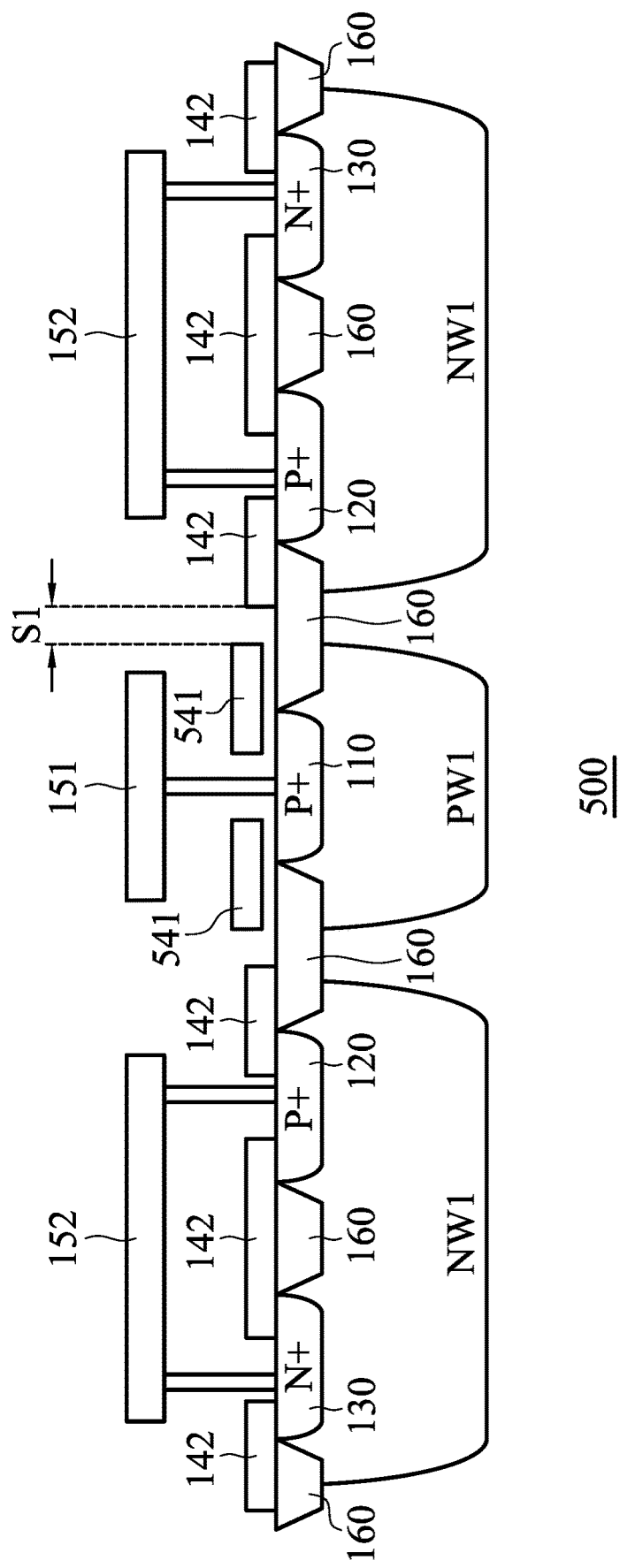
FIG. 5 is a cross-sectional view of a semiconductor structure in accordance with another embodiment of the invention.

FIG. 5 is a cross-sectional view of a semiconductor structure in accordance with another embodiment of the invention. Comparing the semiconductor structure 500 in FIG. 5 with the semiconductor structure 100 in FIG. 1, the semiconductor structure 500 further includes a first poly-silicon layer 541, in which the first poly-silicon layer 541 is deposited on the first P-type diffusion region 110. As shown in FIG. 5, the first poly-silicon layer 541 is not electrically coupled to the first electrode 151. In other words, the first poly-silicon layer 541 is floating.

Figure 6:
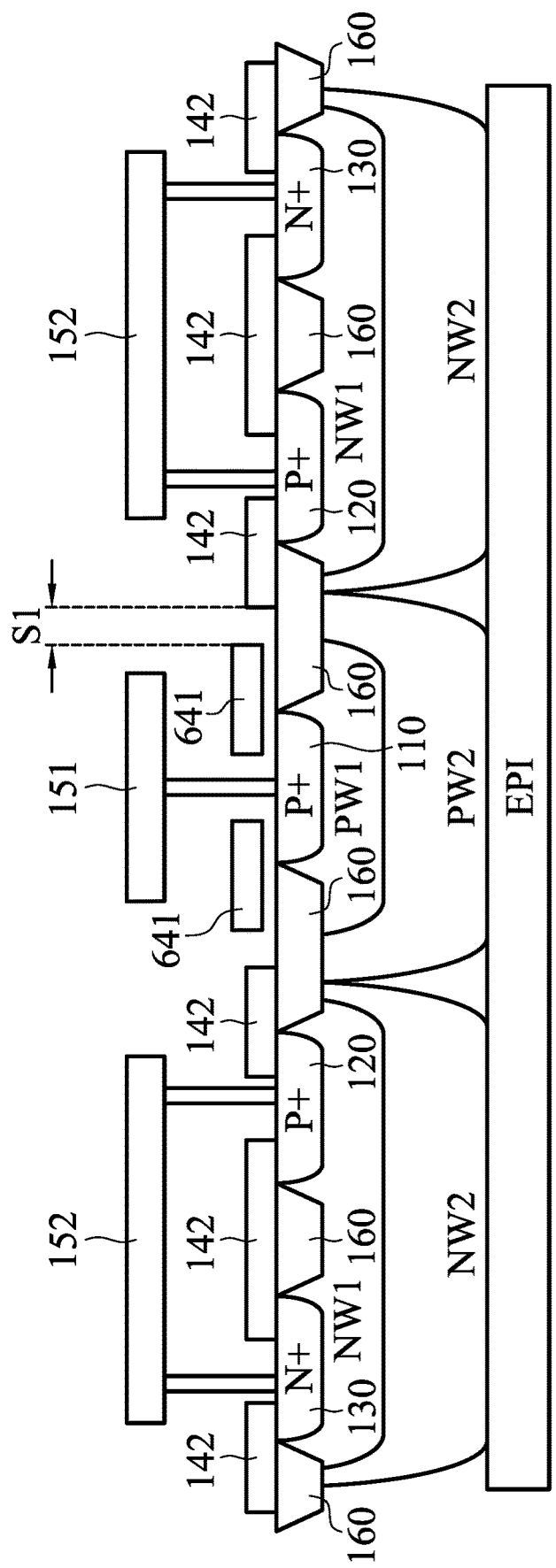
FIG. 6 is a cross-sectional view of a semiconductor structure in accordance with another embodiment of the invention.

FIG. 6 is a cross-sectional view of a semiconductor structure in accordance with another embodiment of the invention. Comparing the semiconductor structure 600 in FIG. 6 with the semiconductor structure 200 in FIG. 2, the semiconductor structure 600 further includes a first poly-silicon layer 641, in which the first poly-silicon layer 641 is not electrically coupled to the first electrode 151. In other words, the first poly-silicon layer 641 is floating.

Figure 7:
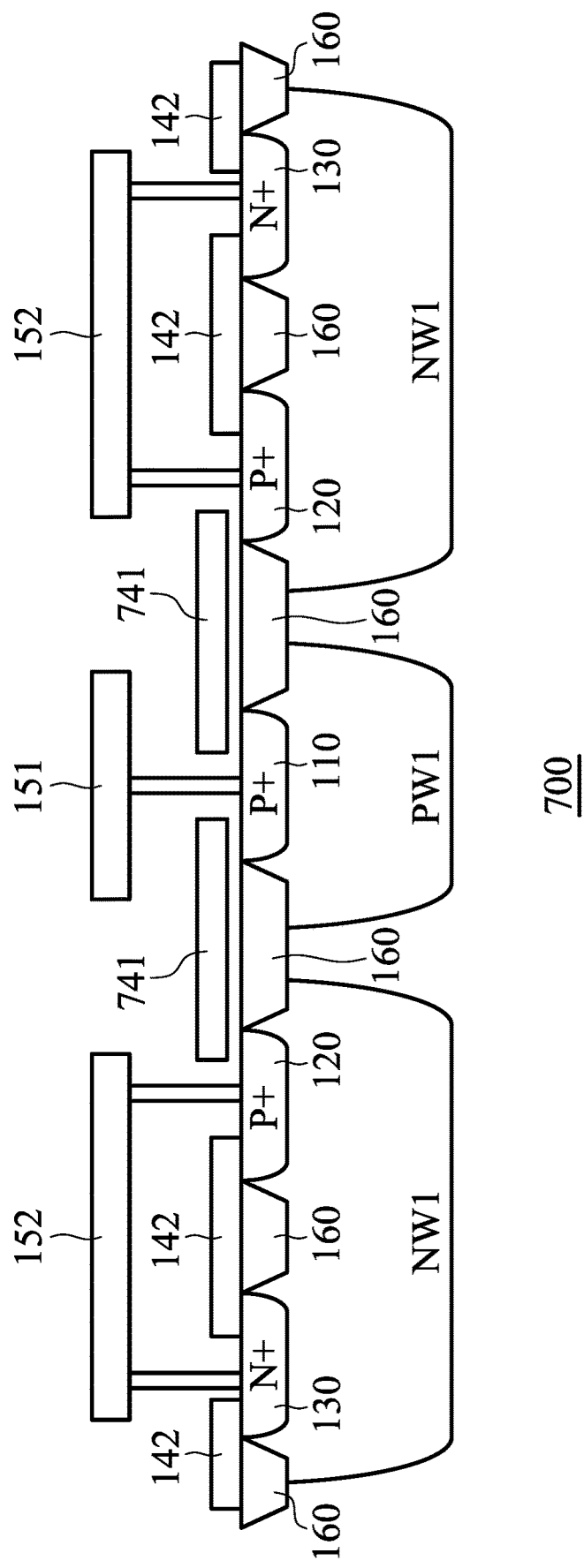
FIG. 7 is a cross-sectional view of a semiconductor structure in accordance with another embodiment of the invention.

FIG. 7 is a cross-sectional view of a semiconductor structure in accordance with another embodiment of the invention. Comparing the semiconductor structure 700 in FIG. 7 with the semiconductor structure 100 in FIG. 1, the semiconductor structure 700 further includes a first poly-silicon layer 741. As shown in FIG. 7, the first poly-silicon layer 741 is deposited on the first P-type diffusion region 110 and the second P-type diffusion region 120 and stretched from the first P-type diffusion region 110 to the second P-type diffusion region 120. In addition, the first poly-silicon layer 741 is floating.

According to an embodiment of the invention, since the first poly-silicon layer 741 is stretched from the first P-type diffusion region 110 to the second P-type diffusion region 120, the first distance S1 in FIG. 1 can be omitted, such that chip area of the semiconductor structure 700 can be decreased to reduce the manufacturing cost. According to another embodiment of the invention, the first poly-silicon layer 741 may be coupled to the first electrode 151 as illustrated in FIG. 1, which is not repeated herein.

Figure 8:
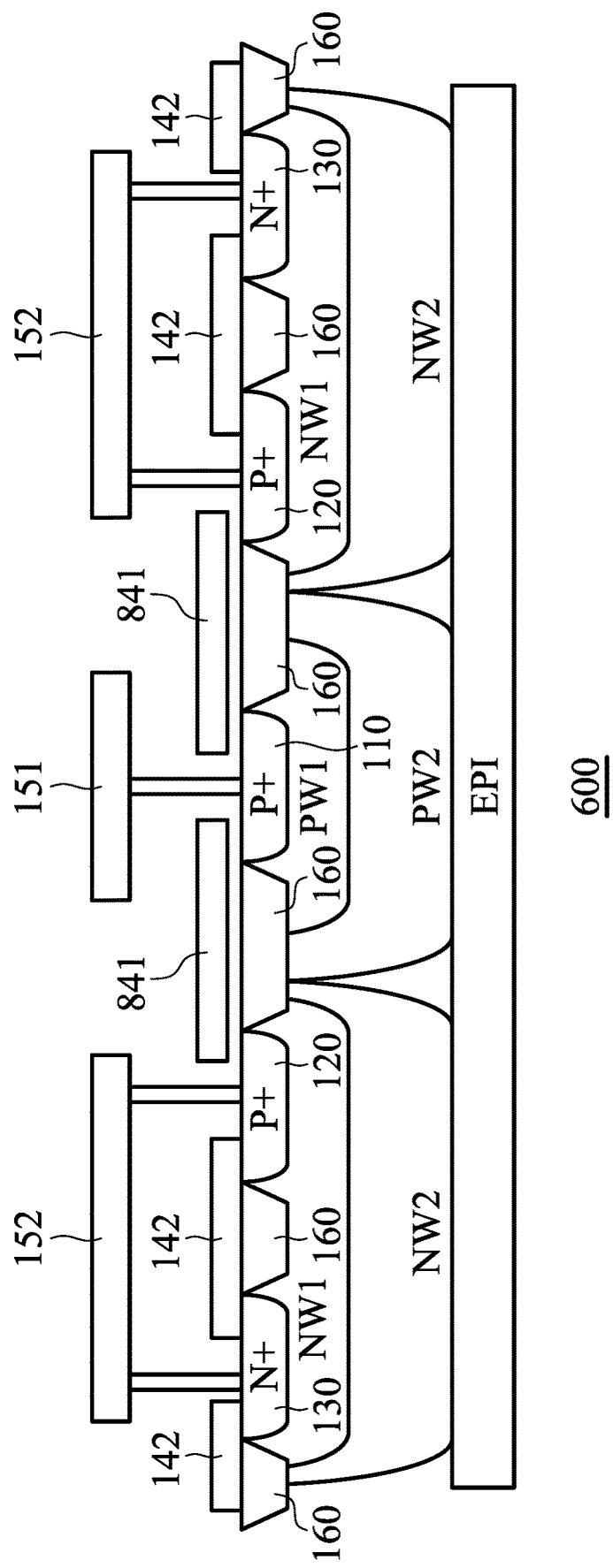
FIG. 8 is a cross-sectional view of a semiconductor structure in accordance with another embodiment of the invention.

FIG. 8 is a cross-sectional view of a semiconductor structure in accordance with another embodiment of the invention. Comparing the semiconductor structure 800 in FIG. 8 with the semiconductor structure 200 in FIG. 2, the semiconductor structure 800 further includes a first poly-silicon layer 841. As shown in FIG. 8, the first poly-silicon layer 841 is deposited on the first P-type diffusion layer 110 and the second P-type diffusion layer 120 and stretched from the first P-type diffusion layer 110 to the second P-type diffusion layer 120. In addition, the first poly-silicon layer 841 is floating.

According to an embodiment of the invention, since the first poly-silicon layer 841 is stretched from the first P-type diffusion layer 110 to the second P-type diffusion layer 120, the first distance S1 shown in FIG. 2 can be omitted. Compared to the semiconductor structure 200 in FIG. 2, the chip area of the semiconductor structure 800 is less such that the manufacturing cost can be reduced. According to another embodiment of the invention, the first poly-silicon layer 841 may be electrically coupled to the first electrode 151 as illustrated in FIG. 2, which is not repeated herein.

Figure 9:
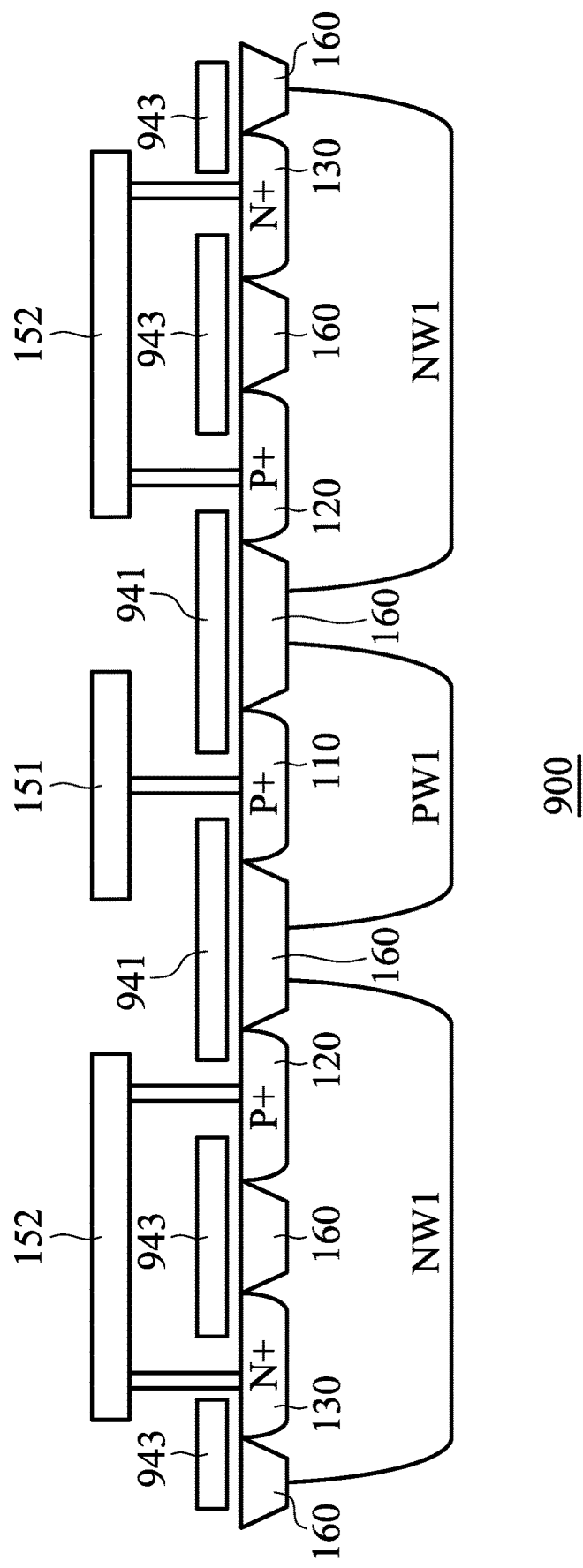
FIG. 9 is a cross-sectional view of a semiconductor structure in accordance with another embodiment of the invention.

FIG. 9 is a cross-sectional view of a semiconductor structure in accordance with another embodiment of the invention. Comparing the semiconductor structure 900 in FIG. 9 with the semiconductor structure 700 in FIG. 7, the semiconductor structure 900 further includes a first poly-silicon layer 941 and a second poly-silicon layer 943, in which the oxidative protection layer 142 of the semiconductor structure 700 is replaced by the second poly-silicon layer 943.

As shown in FIG. 9, the first poly-silicon layer 941 is also deposited on the first P-type diffusion region 110 and the second P-type diffusion region 120 and stretched from the first P-type diffusion region 110 to the second P-type diffusion region. The second poly-silicon layer 943 is deposited on the second P-type diffusion region 120 and the first N-type diffusion region 130.

According to an embodiment of the invention, since the oxidative protection layer 142 of the semiconductor structure 700 in FIG. 7 is replaced by the second poly-silicon layer 943, poly-silicon layers are deposited on the first P-type diffusion region 110, the second P-type diffusion region 120, and the first N-type diffusion region 130 such that the manufacturing cost of the mask for the oxidative protection layer can be reduced.

According to an embodiment of the invention, the first poly-silicon layer 941 is floating. According to another embodiment of the invention, the first poly-silicon layer 941 may be coupled to the first electrode 151. According to an embodiment of the invention, the second poly-silicon layer 943 is floating. According to another embodiment of the invention, the second poly-silicon layer 943 may be coupled to the second electrode 152.

Figure 10:
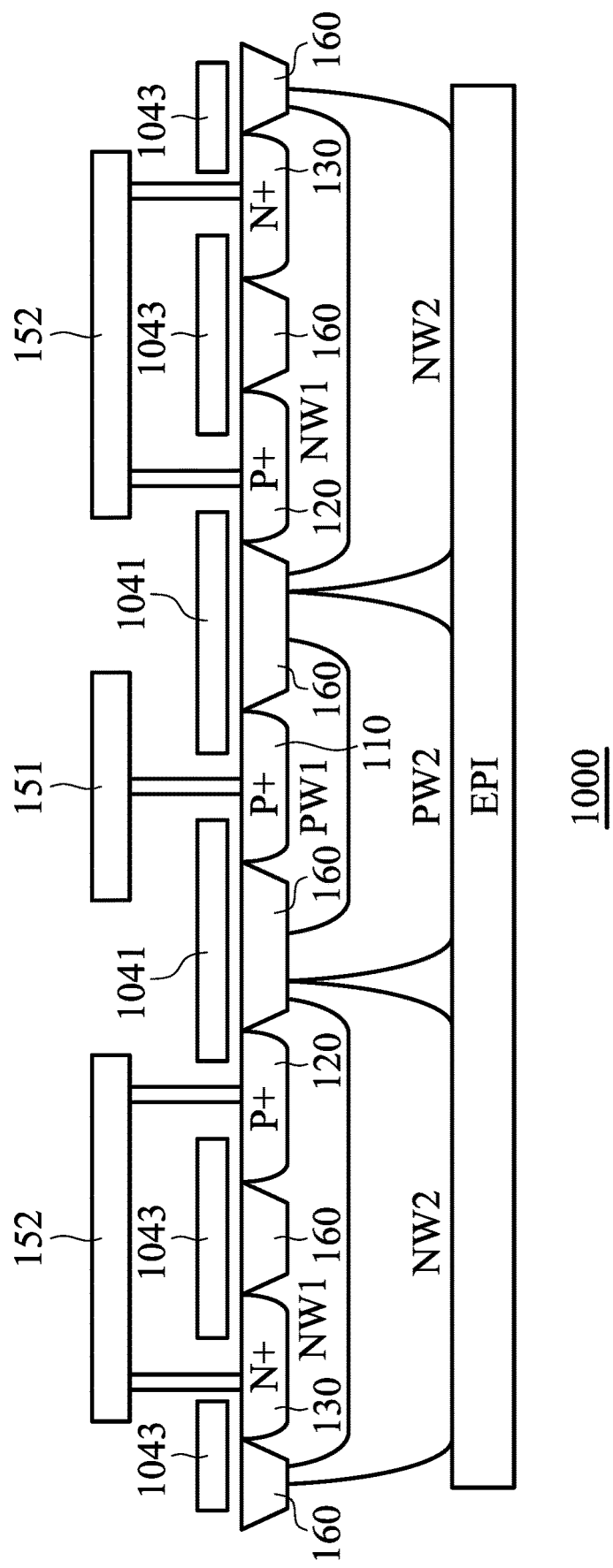
FIG. 10 is a cross-sectional view of a semiconductor structure in accordance with another embodiment of the invention.

FIG. 10 is a cross-sectional view of a semiconductor structure in accordance with another embodiment of the invention. Comparing the semiconductor structure 1000 in FIG. 10 with the semiconductor structure 800 in FIG. 8, the semiconductor structure 1000 further includes a first poly-silicon layer 1041 and a second poly-silicon layer 1043, in which the oxidative protection layer 142 of the semiconductor structure 800 is replaced by the second poly-silicon layer 1043.

According to an embodiment of the invention, since the oxidative protection layer 142 of the semiconductor structure 800 in FIG. 8 is replaced by the second poly-silicon layer 1043, poly-silicon layers are deposited on the first P-type diffusion layer 110, the second P-type diffusion layer 120, and the first N-type diffusion layer 130 such that the manufacturing cost of the mask for the oxidative protection layer can be reduced.

According to an embodiment of the invention, the first poly-silicon layer 1041 is floating. According to another embodiment of the invention, the first poly-silicon layer 1041 may be coupled to the first electrode 151. According to an embodiment of the invention, the second poly-silicon layer 1043 is floating. According to another embodiment of the invention, the second poly-silicon layer 1043 may be coupled to the second electrode 152.

Semiconductor structures for ESD protection are provided herein, which are configured to effectively improve the protection capability of ESD machine mode. According to some embodiments of the invention, the protection capability of ESD machine mode can be as high as 550V.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
    a first P-well;
    a first P-type diffusion region, deposited in the first P-well and coupled to a first electrode;
    a first N-well, surrounding the first P-well;
    a first N-type diffusion region, deposited in the first N-well;
    a second P-type diffusion region, deposited between the first P-type diffusion region and the first N-type diffusion region and deposited in the first N-well, wherein the second P-type diffusion region and the first N-type diffusion region are coupled to a second electrode; and
    a first poly-silicon layer, deposited on the first P-type diffusion region, wherein the first poly-silicon layer is electrically coupled to the first electrode.

2. The semiconductor structure of claim 1, further comprising:
    an epitaxial layer;
    a second P-well, deposited on the epitaxial layer, wherein the first P-well is deposited in the second P-well; and
    a second N-well, deposited on the epitaxial layer and adjacent to the second P-well, wherein the first N-well is deposited in the second N-well, wherein epitaxial layer is N-type.

3. The semiconductor structure of claim 1, further comprising:

a first oxidative protection layer, deposited on the second P-type diffusion region and adjacent to the first poly-silicon layer, wherein there is a first distance between the oxidative protection layer and the first poly-silicon layer; and a shallow trench isolation, deposited between the first P-type diffusion region and the second P-type diffusion region.

4. The semiconductor structure of claim 3, wherein there is a second distance between the first P-type diffusion region and the shallow trench isolation, and the second P-type diffusion region is directly coupled to the shallow trench isolation.

5. The semiconductor structure of claim 1, wherein the first poly-silicon layer is deposited on the first P-type diffusion region and the second P-type diffusion region.

6. The semiconductor structure of claim 1, further comprising:

a second poly-silicon layer, deposited on the second P-type diffusion region and the first N-type diffusion region, wherein the second poly-silicon region is floating.

7. An ESD protection device for discharging electrostatic charge from a first electrode to a second electrode, comprising:

a first P-well;

a first P-type diffusion region, deposited in the first P-well and coupled to the first electrode;

a first N-well, surrounding the first P-well;

a first N-type diffusion region, deposited in the first N-well;

a second P-type diffusion region, deposited between the first P-type diffusion region and the first N-type diffusion region, and deposited in the first N-well, wherein the second P-type diffusion region and the first N-type diffusion region are coupled to the second electrode; and a first poly-silicon layer, deposited on the first P-type diffusion region, wherein the first poly-silicon layer is electrically coupled to the first electrode.

8. The ESD protection device of claim 7, further comprising:

a first oxidative protection layer, deposited on the second P-type diffusion region and adjacent to the first poly-silicon layer, wherein there is a first distance between the oxidative protection layer and the first poly-silicon layer; and a shallow trench isolation, deposited between the first P-type diffusion region and the second P-type diffusion region.

9. The ESD protection device of claim 8, wherein there is a second distance between the first P-type diffusion region and the shallow trench isolation, and the second diffusion region is directly coupled to the first shallow trench isolation.

10. The ESD protection device of claim 7, wherein the first poly-silicon layer is deposited on the first P-type diffusion region and the second P-type diffusion region.

11. The ESD protection device of claim 7, further comprising:

a second poly-silicon layer, deposited on the second P-type diffusion region and the first N-type diffusion region, wherein the second poly-silicon layer is floating.

12. A semiconductor structure, comprising:

a first P-well;

a first P-type diffusion region, deposited in the first P-well and coupled to a first electrode;

a first N-well, surrounding the first P-well;

a first N-type diffusion region, deposited in the first N-well;

a second P-type diffusion region, deposited between the first P-type diffusion region and the first N-type diffusion region and deposited in the first N-well, wherein the second P-type diffusion region and the first N-type diffusion region are coupled to a second electrode; and a first poly-silicon layer, deposited on the first P-type diffusion region, wherein the first poly-silicon layer is floating.

13. An ESD protection device for discharging electrostatic charge from a first electrode to a second electrode, comprising:

a first P-well;

a first P-type diffusion region, deposited in the first P-well and coupled to the first electrode;

a first N-well, surrounding the first P-well;

a first N-type diffusion region, deposited in the first N-well;

a second P-type diffusion region, deposited between the first P-type diffusion region and the first N-type diffusion region, and deposited in the first N-well, wherein the second P-type diffusion region and the first N-type diffusion region are coupled to the second electrode; and a first poly-silicon layer, deposited on the first P-type diffusion region, wherein the first poly-silicon layer is floating.

* * * * *